United States Patent
Shibata et al.

(10) Patent No.: US 12,040,695 B2
(45) Date of Patent: Jul. 16, 2024

(54) POWER CONVERSION DEVICE AND METHOD FOR MANUFACTURING THE SAME

(71) Applicant: TMEIC Corporation, Chuo-ku (JP)

(72) Inventors: Naoya Shibata, Tokyo (JP); Masahiro Kinoshita, Tokyo (JP); Issei Fukasawa, Tokyo (JP)

(73) Assignee: TMEIC CORPORATION, Chuo-ku (JP)

( * ) Notice: Subject to any disclaimer, the term of this patent is extended or adjusted under 35 U.S.C. 154(b) by 264 days.

(21) Appl. No.: 17/754,633

(22) PCT Filed: Dec. 19, 2019

(86) PCT No.: PCT/JP2019/049881
§ 371 (c)(1),
(2) Date: Apr. 7, 2022

(87) PCT Pub. No.: WO2021/124518
PCT Pub. Date: Jun. 24, 2021

(65) Prior Publication Data
US 2022/0376606 A1   Nov. 24, 2022

(51) Int. Cl.
*H02M 7/00* (2006.01)
*H02M 1/10* (2006.01)
*H02M 1/42* (2007.01)

(52) U.S. Cl.
CPC ............ *H02M 1/10* (2013.01); *H02M 7/003* (2013.01); *H02M 1/42* (2013.01)

(58) Field of Classification Search
CPC .......... H02M 1/10; H02M 1/327; H02M 1/42; H02M 7/003
See application file for complete search history.

(56) References Cited

U.S. PATENT DOCUMENTS

2020/0146174 A1* 5/2020 Song ................... H02M 7/003

FOREIGN PATENT DOCUMENTS

| JP | 2005-187567 A | 7/2005 |
| JP | 2008-72109 A | 3/2008 |

(Continued)

OTHER PUBLICATIONS

International Search Report and Written Opinion mailed on Mar. 17, 2020 in PCT/JP2019/049881 filed on Dec. 19, 2019 (total 11 pages).

(Continued)

*Primary Examiner* — Fred E Finch, III
(74) *Attorney, Agent, or Firm* — Oblon, McClelland, Maier & Neustadt, L.L.P.

(57) ABSTRACT

A power conversion device includes a power conversion module, a phase change material, a heat dissipation member, a cooling mechanism, and a controller. A semiconductor switching element and a freewheeling diode configure a power conversion circuit. The phase change material is provided on a principal plane of a casing. The heat dissipation member includes a heat dissipation surface. The heat dissipation surface is overlapped with the principal plane to sandwich the phase change material. The cooling mechanism cools the heat dissipation member. The controller generates a driving signal for driving the power conversion circuit and controls the cooling mechanism. The controller includes a predetermined heating operation. The heating operation may drive the power conversion circuit, in a state that the cooling mechanism is stopped or intermittently operated, such that heat generation occurs in both the semiconductor switching element and the freewheeling diode.

3 Claims, 14 Drawing Sheets

(56) References Cited

FOREIGN PATENT DOCUMENTS

| | | |
|---|---|---|
| JP | 2016-104862 A | 6/2016 |
| JP | 2019-47695 A | 3/2019 |
| JP | 6540612 B2 | 7/2019 |

OTHER PUBLICATIONS

International Preliminary Report on Patentability and Written Opinion issued Jun. 30, 2022, in PCT/JP2019/049881 (submitting English translation only), 6 pages.
Indian Office Action issued Aug. 10, 2022 in Indian Patent Application No. 202217020003, 5 pages.

* cited by examiner

FIG. 10

| No. | COOLING CONTROL MODE | NUMBER OF POWER CONVERSION MODES | FIRST POWER CONVERSION MODE | SECOND POWER CONVERSION MODE | HEATING OPERATION TIME | CONTROL TARGET VALUE (HEATING OPERATION OUTPUT) |
|---|---|---|---|---|---|---|
| 1 | OFF | SINGLE | CHARGE MODE | NOTHING | CALCULATION | FIXED |
| 2 | OFF | SINGLE | LOW POWER FACTOR DISCHARGE MODE | NOTHING | CALCULATION | FIXED |
| 3 | NORMALLY ON | SINGLE | LOW POWER FACTOR DISCHARGE MODE | NOTHING | CALCULATION | FIXED |
| 4 | INTERMITTENT ON | SINGLE | CHARGE MODE | NOTHING | CALCULATION | FIXED |
| 5 | INTERMITTENT ON | SINGLE | LOW POWER FACTOR DISCHARGE MODE | NOTHING | CALCULATION | FIXED |
| 6 | OFF | SINGLE | CHARGE MODE | NOTHING | FIXED | CALCULATION |
| 7 | OFF | SINGLE | LOW POWER FACTOR DISCHARGE MODE | NOTHING | FIXED | CALCULATION |
| 8 | NORMALLY ON | SINGLE | LOW POWER FACTOR DISCHARGE MODE | NOTHING | FIXED | CALCULATION |
| 9 | INTERMITTENT ON | SINGLE | CHARGE MODE | NOTHING | CALCULATION | CALCULATION |
| 10 | INTERMITTENT ON | SINGLE | LOW POWER FACTOR DISCHARGE MODE | NOTHING | CALCULATION | CALCULATION |
| 11 | OFF | MULTIPLE TYPES | CHARGE MODE | LOW POWER FACTOR DISCHARGE MODE | CALCULATION | FIXED |
| 12 | OFF | MULTIPLE TYPES | LOW POWER FACTOR DISCHARGE MODE | CHARGE MODE | CALCULATION | FIXED |
| 13 | NORMALLY ON | MULTIPLE TYPES | LOW POWER FACTOR DISCHARGE MODE | CHARGE MODE | CALCULATION | FIXED |
| 14 | INTERMITTENT ON | MULTIPLE TYPES | CHARGE MODE | LOW POWER FACTOR DISCHARGE MODE | CALCULATION | FIXED |
| 15 | INTERMITTENT ON | MULTIPLE TYPES | LOW POWER FACTOR DISCHARGE MODE | CHARGE MODE | CALCULATION | FIXED |
| 16 | OFF | MULTIPLE TYPES | CHARGE MODE | LOW POWER FACTOR DISCHARGE MODE | FIXED | CALCULATION |
| 17 | OFF | MULTIPLE TYPES | LOW POWER FACTOR DISCHARGE MODE | CHARGE MODE | FIXED | CALCULATION |
| 18 | NORMALLY ON | MULTIPLE TYPES | LOW POWER FACTOR DISCHARGE MODE | CHARGE MODE | FIXED | CALCULATION |
| 19 | INTERMITTENT ON | MULTIPLE TYPES | CHARGE MODE | LOW POWER FACTOR DISCHARGE MODE | FIXED | CALCULATION |
| 20 | INTERMITTENT ON | MULTIPLE TYPES | LOW POWER FACTOR DISCHARGE MODE | CHARGE MODE | FIXED | CALCULATION |
| 21 | OFF | MULTIPLE TYPES | CHARGE MODE | LOW POWER FACTOR DISCHARGE MODE | CALCULATION | CALCULATION |
| 22 | OFF | MULTIPLE TYPES | LOW POWER FACTOR DISCHARGE MODE | CHARGE MODE | FIXED | CALCULATION |
| 23 | NORMALLY ON | MULTIPLE TYPES | LOW POWER FACTOR DISCHARGE MODE | CHARGE MODE | FIXED | CALCULATION |
| 24 | INTERMITTENT ON | MULTIPLE TYPES | CHARGE MODE | LOW POWER FACTOR DISCHARGE MODE | FIXED | CALCULATION |
| 25 | INTERMITTENT ON | MULTIPLE TYPES | LOW POWER FACTOR DISCHARGE MODE | CHARGE MODE | FIXED | CALCULATION |

FIG. 11

| No. | COOLING CONTROL MODE | NUMBER OF POWER CONVERSION MODES | FIRST POWER CONVERSION MODE | SECOND POWER CONVERSION MODE | HEATING OPERATION TIME | CONTROL TARGET VALUE (HEATING OPERATION OUTPUT) |
|---|---|---|---|---|---|---|
| 26 | OFF | MULTIPLE TYPES | CHARGE MODE | LOW POWER FACTOR DISCHARGE MODE | CALCULATION | CALCULATION |
| 27 | OFF | MULTIPLE TYPES | LOW POWER FACTOR DISCHARGE MODE | CHARGE MODE | CALCULATION | CALCULATION |
| 28 | NORMALLY ON | MULTIPLE TYPES | LOW POWER FACTOR DISCHARGE MODE | CHARGE MODE | CALCULATION | CALCULATION |
| 29 | INTERMITTENT ON | MULTIPLE TYPES | CHARGE MODE | LOW POWER FACTOR DISCHARGE MODE | CALCULATION | CALCULATION |
| 30 | INTERMITTENT ON | MULTIPLE TYPES | LOW POWER FACTOR DISCHARGE MODE | CHARGE MODE | CALCULATION | CALCULATION |
| 31 | OFF | SINGLE | CHARGE MODE | NOTHING | UNTIL REACHING PROTECTION TEMPERATURE | FIXED |
| 32 | OFF | SINGLE | LOW POWER FACTOR DISCHARGE MODE | NOTHING | UNTIL REACHING PROTECTION TEMPERATURE | FIXED |
| 33 | NORMALLY ON | SINGLE | LOW POWER FACTOR DISCHARGE MODE | NOTHING | UNTIL REACHING PROTECTION TEMPERATURE | FIXED |
| 34 | INTERMITTENT ON | SINGLE | CHARGE MODE | NOTHING | UNTIL REACHING PROTECTION TEMPERATURE | FIXED |
| 35 | INTERMITTENT ON | SINGLE | LOW POWER FACTOR DISCHARGE MODE | NOTHING | UNTIL REACHING PROTECTION TEMPERATURE | FIXED |
| 36 | OFF | SINGLE | CHARGE MODE | NOTHING | UNTIL REACHING PROTECTION TEMPERATURE | CALCULATION |
| 37 | OFF | SINGLE | LOW POWER FACTOR DISCHARGE MODE | NOTHING | UNTIL REACHING PROTECTION TEMPERATURE | CALCULATION |
| 38 | NORMALLY ON | SINGLE | LOW POWER FACTOR DISCHARGE MODE | NOTHING | UNTIL REACHING PROTECTION TEMPERATURE | CALCULATION |
| 39 | INTERMITTENT ON | SINGLE | CHARGE MODE | NOTHING | UNTIL REACHING PROTECTION TEMPERATURE | CALCULATION |
| 40 | INTERMITTENT ON | SINGLE | LOW POWER FACTOR DISCHARGE MODE | NOTHING | UNTIL REACHING PROTECTION TEMPERATURE | CALCULATION |
| 41 | OFF | MULTIPLE TYPES | CHARGE MODE | LOW POWER FACTOR DISCHARGE MODE | UNTIL REACHING PROTECTION TEMPERATURE | FIXED |
| 42 | OFF | MULTIPLE TYPES | LOW POWER FACTOR DISCHARGE MODE | CHARGE MODE | UNTIL REACHING PROTECTION TEMPERATURE | FIXED |
| 43 | NORMALLY ON | MULTIPLE TYPES | LOW POWER FACTOR DISCHARGE MODE | CHARGE MODE | UNTIL REACHING PROTECTION TEMPERATURE | FIXED |
| 44 | INTERMITTENT ON | MULTIPLE TYPES | CHARGE MODE | LOW POWER FACTOR DISCHARGE MODE | UNTIL REACHING PROTECTION TEMPERATURE | FIXED |
| 45 | INTERMITTENT ON | MULTIPLE TYPES | LOW POWER FACTOR DISCHARGE MODE | CHARGE MODE | UNTIL REACHING PROTECTION TEMPERATURE | FIXED |
| 46 | OFF | MULTIPLE TYPES | CHARGE MODE | LOW POWER FACTOR DISCHARGE MODE | UNTIL REACHING PROTECTION TEMPERATURE | CALCULATION |
| 47 | OFF | MULTIPLE TYPES | LOW POWER FACTOR DISCHARGE MODE | CHARGE MODE | UNTIL REACHING PROTECTION TEMPERATURE | CALCULATION |
| 48 | NORMALLY ON | MULTIPLE TYPES | LOW POWER FACTOR DISCHARGE MODE | CHARGE MODE | UNTIL REACHING PROTECTION TEMPERATURE | CALCULATION |
| 49 | INTERMITTENT ON | MULTIPLE TYPES | CHARGE MODE | LOW POWER FACTOR DISCHARGE MODE | UNTIL REACHING PROTECTION TEMPERATURE | CALCULATION |
| 50 | INTERMITTENT ON | MULTIPLE TYPES | LOW POWER FACTOR DISCHARGE MODE | CHARGE MODE | UNTIL REACHING PROTECTION TEMPERATURE | CALCULATION |

POWER CONVERSION DEVICE AND METHOD FOR MANUFACTURING THE SAME

FIELD

The present application relates to a power conversion device using phase change materials and a method for manufacturing the same.

BACKGROUND

A semiconductor apparatus including a thermal interface material (TIM) is conventionally known as disclosed in JP 6540612 B, for example. The TIM reduces a thermal resistance between a semiconductor device and a heat dissipation body. The TIM used in the above-mentioned prior art is a phase change material.

CITATION LIST

Patent Literature

[PTL 1] JP 6540612 B

SUMMARY

Technical Problem

The phase change material improves adhesion by heating and softening. Improving the adhesion can reduce a contact thermal resistance. As a result, heat is effectively transferred from a power conversion module to a heat dissipation member via the phase change material.

To effectively reduce the contact thermal resistance of the phase change material, it is not desired that a large heating unevenness occurs at a surface on which the power conversion module and the heat dissipation member are in contact with each other. In this regard, the above-mentioned prior art lacks a study on a temperature unevenness that occurs at the time of heating of the phase change material, and room for improvement still remains.

The present application has been made to solve the above-mentioned problem, and intends to provide a power conversion device and a method for manufacturing the same, which are improved so as to suppress the occurrence of unevenness in heating and softening of the phase change material.

Solution to Problem

A power conversion device according to the present application includes a power conversion module, a phase change material, a heat dissipation member, cooling means, and control means. The power conversion module includes a casing having a principal plane, and a semiconductor switching element and a freewheeling diode housed in the casing and arranged in a plane direction of the principal plane. The semiconductor switching element and the freewheeling diode configure a power conversion circuit. The phase change material is provided on the principal plane of the casing. The heat dissipation member includes a heat dissipation surface. The heat dissipation surface is overlapped with the principal plane so as to sandwich the phase change material. The cooling means cools the heat dissipation member. The control means generates a driving signal for driving the power conversion circuit and controls the cooling means. The control means includes a predetermined heating operation.

The heating operation may drive the power conversion circuit, in a state where the cooling means is stopped or intermittently operated, in such a manner that heat generation occurs in both the semiconductor switching element and the freewheeling diode.

The heating operation may execute, in a state where the cooling means is continuously driven, a low power factor AC-DC conversion mode. The low power factor AC-DC conversion mode may drive the power conversion circuit so as to generate AC power from DC power at a predetermined target power factor less than 1.

A method for manufacturing a power conversion device according to the present application includes a process for preparing a power conversion module including a casing having a principal plane and a phase change material provided on the principal plane, a process for overlapping a heat dissipation surface of a heat dissipation member with the principal plane so as to sandwich the phase change material, and a process for performing a heating operation for heating the phase change material in a product pre-shipment test. The power conversion module includes a semiconductor switching element and a freewheeling diode. The semiconductor switching element and the freewheeling diode are housed in the casing and arranged in a plane direction of the principal plane. The semiconductor switching element and the freewheeling diode configure a power conversion circuit.

The process for performing the heating operation may drive the power conversion circuit, in a state where cooling means for cooling the heat dissipation member is stopped or intermittently operated, in such a manner that heat generation occurs in both the semiconductor switching element and the freewheeling diode.

The process for performing the heating operation may execute, in a state where the cooling means for cooling the heat dissipation member is continuously driven, a low power factor AC-DC conversion mode. The low power factor AC-DC conversion mode may drive the power conversion circuit so as to generate AC power from DC power at a predetermined target power factor less than 1.

Advantageous Effects of Invention

According to the power conversion device and the method for manufacturing the power conversion device described above, the heating operation can be performed in such a manner that heat generation occurs in the semiconductor switching element and the freewheeling diode. According to this heating operation, in a state where the temperature unevenness is suppressed in a region adjacent to the semiconductor switching element and the freewheeling diode on the principal plane, the phase change material can be heated and softened. As a result, it is possible to suppress the unevenness occurring in the heating and softening of the phase change material.

BRIEF DESCRIPTION OF DRAWINGS

FIG. 10 is a table illustrating variations of the heating operation performed by the power conversion device according to the embodiment.

FIG. 11 is a table illustrating variations of the heating operation performed by the power conversion device according to the embodiment.

DESCRIPTION OF EMBODIMENTS

Figure 1:
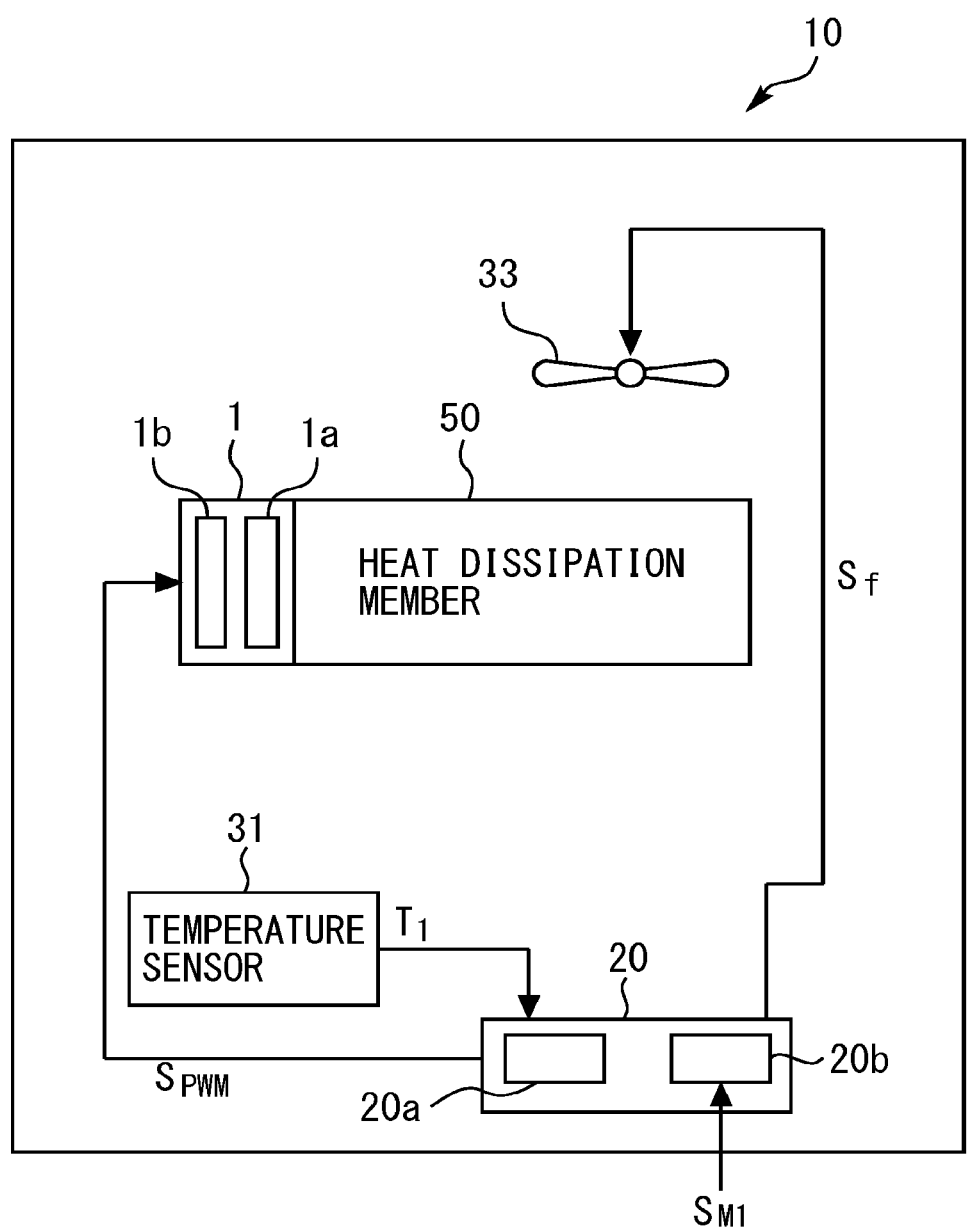
FIG. 1 is a configuration diagram illustrating a power conversion device according to an embodiment.

FIG. 1 is a configuration diagram illustrating a power conversion device 10 according to an embodiment. The power conversion device 10 includes a power conversion unit 1, a heat dissipation member 50, cooling means 33, control means 20, and a temperature sensor 31. The power conversion device 10 includes a housing that accommodates the above-mentioned respective constituent components. This housing may be provided with ventilation holes.

The power conversion unit 1 includes a power conversion circuit 1a and a gate drive substrate 1b. The power conversion circuit 1a is a voltage type three-phase inverter circuit including three arm circuits. The voltage type three-phase inverter circuit is not limited in type particularly. The power conversion circuit 1a includes a plurality of power conversion modules 100, which will be described below with reference to FIG. 2.

The cooling means 33 cools the heat dissipation member 50. The cooling means 33 of the embodiment is, for example, an air-cooling fan. A refrigerant circulation system may be used, as a modified example of the cooling means 33, instead of the air-cooling fan. The refrigerant circulation system of the modified example may include a refrigerant passage that is in contact with the heat dissipation member 50, a radiator provided in the midway of the refrigerant passage, and a circulation pump that circulates the refrigerant in the refrigerant passage. Rotational speed control of the air-cooling fan or driving rotational speed control of the circulation pump can be performed to control ON/OFF of the cooling means 33 and adjust the cooling amount.

The control means 20 includes a power conversion control unit 20a and a temperature control unit 20b. The power conversion control unit 20a transmits a PWM signal $S_{PWM}$ to the power conversion unit 1, for the purpose of driving the power conversion circuit 1a. The temperature control unit 20b transmits a fan control signal $S_f$ to the cooling means 33, for the purpose of controlling the cooling means 33.

The control means 20 may be constructed by one or a plurality of microcomputers. An example of a specific hardware structure of the control means 20 will be described below.

The temperature sensor 31 detects an ambient temperature $T_1$ of the power conversion module 100. A temperature detection signal $T_1$ of the temperature sensor 31 is transmitted to the control means 20.

Figure 2:
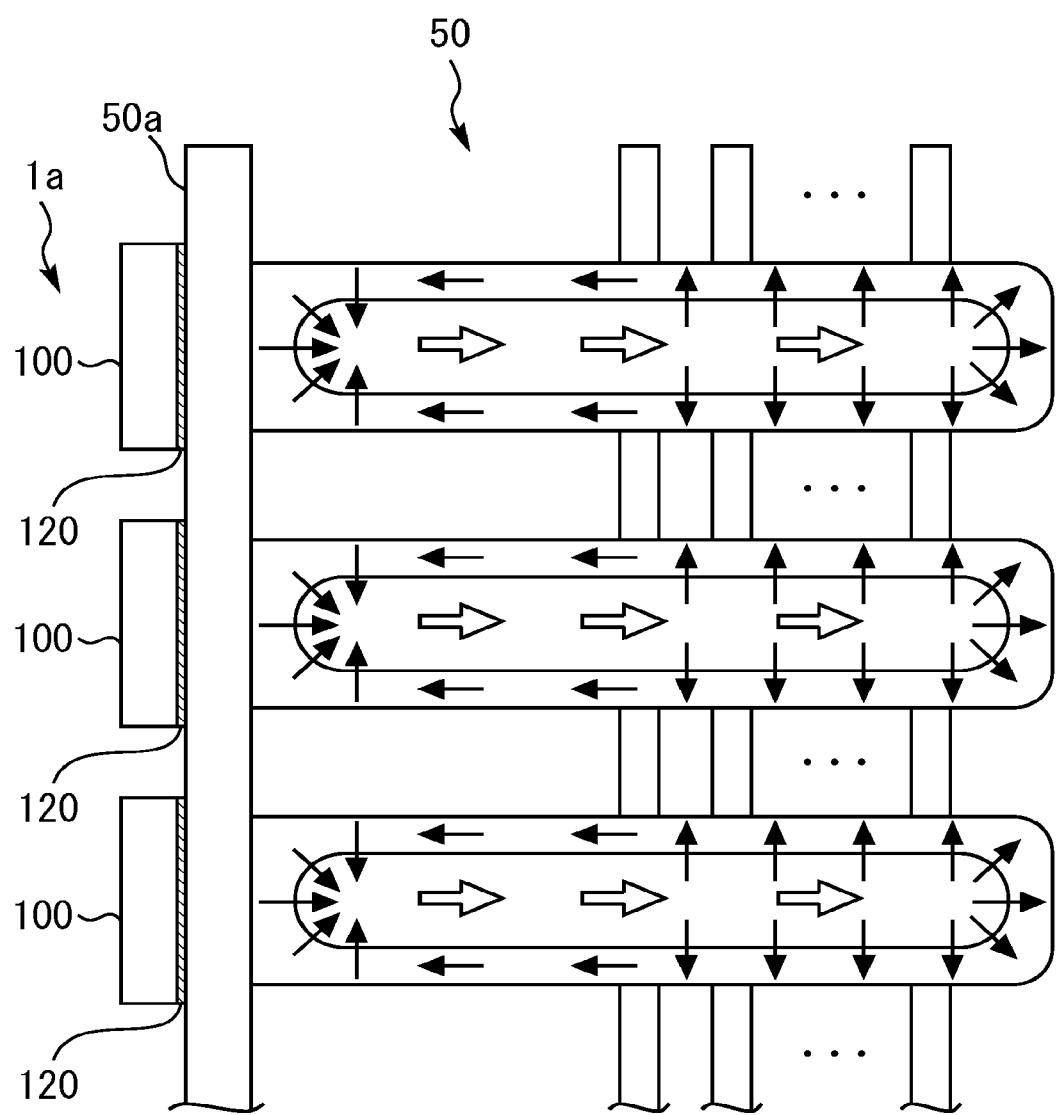
FIG. 2 is a diagram illustrating the power conversion device and a heat dissipation member according to the embodiment.

FIG. 2 is a diagram illustrating the power conversion device 10 and the heat dissipation member 50 according to the embodiment. In the embodiment, the heat dissipation member 50 is a heat pipe, as an example. The heat dissipation member 50 may be deformed into a heat sink.

The heat dissipation member 50 includes a heat dissipation surface 50a. Three power conversion modules 100 are arranged in line on the heat dissipation surface 50a. The heat dissipation surface 50a and a principal plane 101 are overlapped so as to sandwich phase change materials 120. This type of heat transfer layer provided on the heat dissipation surface 50a is also referred to as a thermal interface material (TIM). Various materials, such as grease, are known for the TIM. In the embodiment, the phase change material is used for the TIM.

Figure 3:
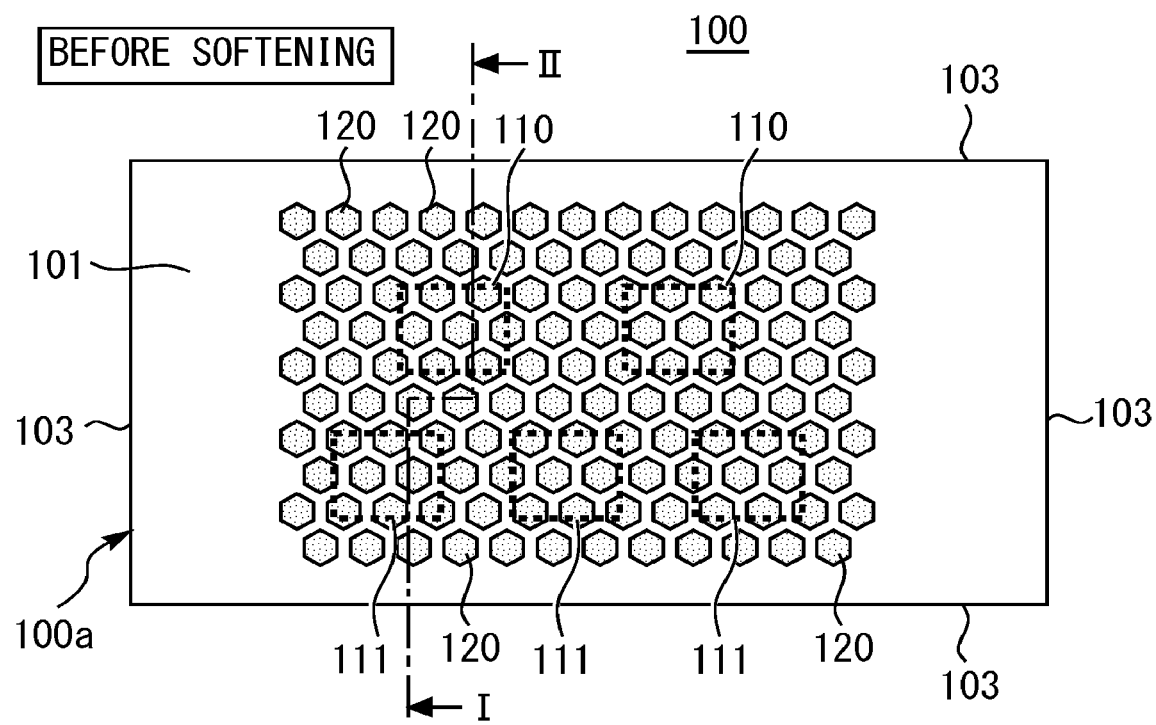
FIG. 3 is a plan view illustrating a power conversion module according to the embodiment.
Figure 4:
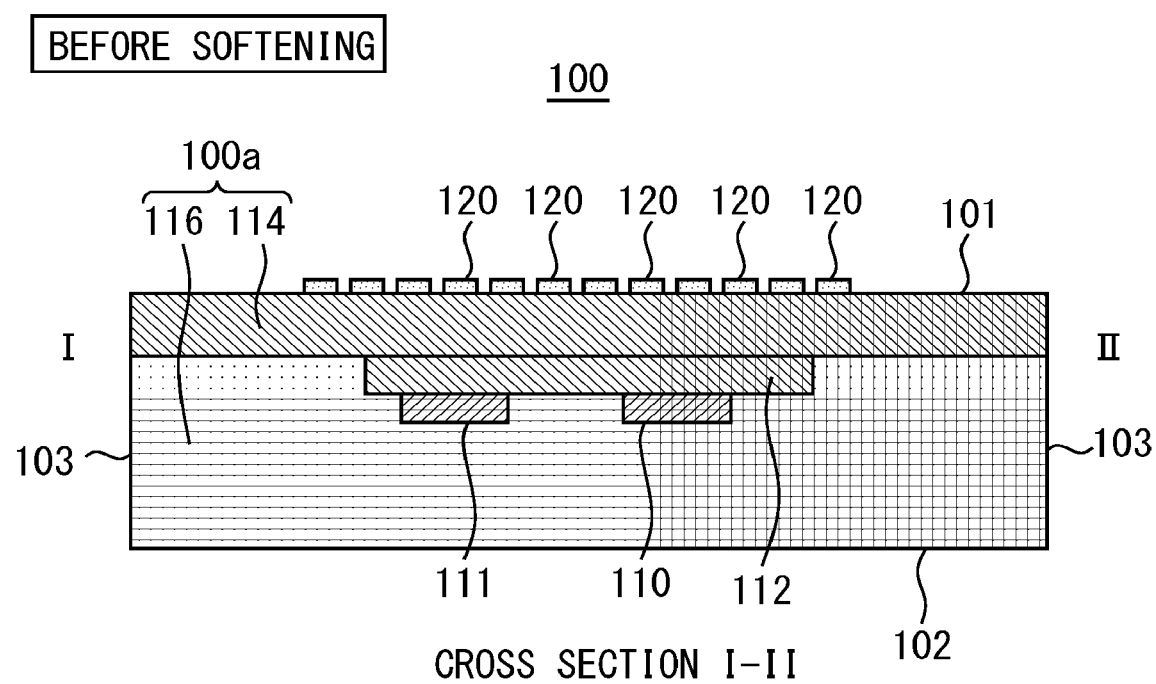
FIG. 4 is a cross-sectional view illustrating the power conversion module according to the embodiment.

FIG. 3 is a plan view illustrating the power conversion module 100 according to the embodiment. FIG. 4 is a cross-sectional view illustrating the power conversion module 100 according to the embodiment. FIG. 4 illustrates a cross section taken along a line I-II illustrated in FIG. 3. FIG. 3 and FIG. 4 illustrate a state of the phase change materials 120 before heating and softening.

The power conversion module 100 includes a casing 100a, a substrate 112 housed in the casing 100a, and semiconductor switching elements 110 and freewheeling diodes 111 implemented on the substrate 112.

The casing 100a is configured by a resin sealing material 116 and a heat dissipation plate 114. The casing 100a has an upper surface 102, a lower surface 101, and four (front, rear, left, and right) side surfaces 103. One surface of the heat dissipation plate 114 corresponds to the lower surface 101 of the casing 100a. In the embodiment, the lower surface 101 of the casing 100a is also referred to as a "principal plane 101", as an example.

The semiconductor switching element 110 is ON/OFF controlled according to a gate driving signal. The semiconductor switching element 110 may be an IGBT, a MOSFET, or a GTO. Semiconductor materials of the semiconductor switching elements 110 and the freewheeling diodes 111 may be silicon or may be a wide band gap semiconductor such as SiC.

In FIG. 3, the heat dissipation plate 114 is seen through from the principal plane 101 side, the semiconductor switching elements 110 and the freewheeling diodes 111 are illustrated with dotted lines. As illustrated in FIG. 3, the semiconductor switching elements 110 and the freewheeling diodes 111 are arranged in a predetermined layout in the plane direction of the principal plane 101. In the embodiment, as an example, the casing 100a is a resin sealed package formed by resin molding. However, as a modified example, the casing 100a may be a resin body having a lid and a box.

The power conversion module 100 includes two semiconductor switching elements 110 and three freewheeling diodes 111. One power conversion module 100 configures one arm circuit. In the embodiment, three power conversion modules 100 provided as illustrated in FIG. 2 construct the power conversion circuit 1a serving as the three-phase inverter circuit.

The phase change materials 120 are provided on the principal plane 101 of the casing 100a. In the embodiment, each phase change material 120 is a hexagonal piece, as an example, and a plurality of phase change materials 120 are arranged on the principal plane 101. However, as a modified example, a single phase change material sheet may be attached to the principal plane 101. It is desired that the semiconductor switching elements 110 and the freewheeling diodes 111 are sufficiently covered by the phase change materials 120, when the principal plane 101 is seen through as illustrated in FIG. 3.

The phase change material 120 has the property of being softened by heating. When the adhesion is improved by softening, the contact thermal resistance decreases. As a result, the heat transfer to the heat dissipation member 50 is enhanced, and therefore the heat dissipation can be enhanced. Since various materials are well known for the phase change materials 120, detailed descriptions thereof are omitted.

Figure 5:
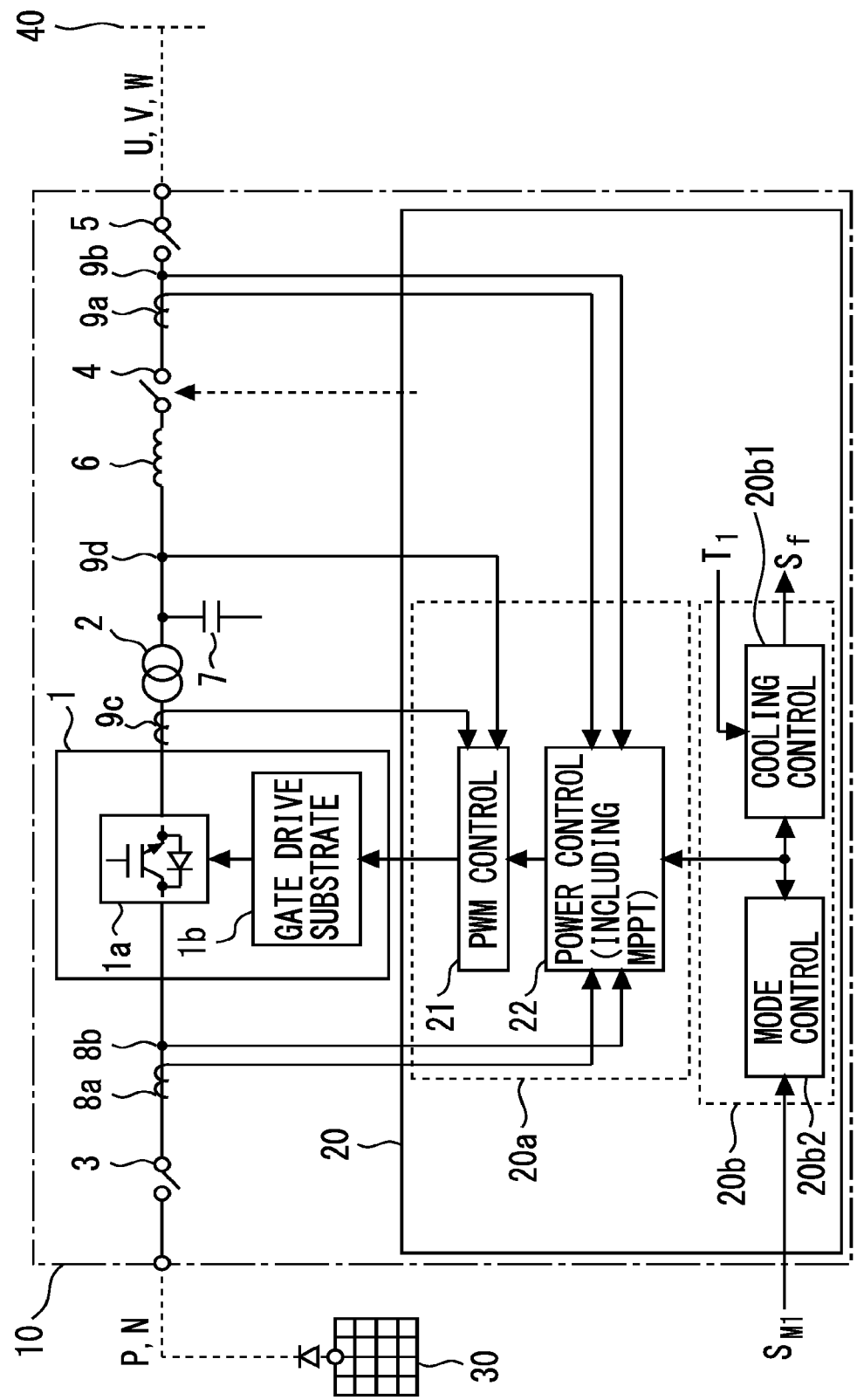
FIG. 5 is a circuit diagram illustrating an exemplary circuit configuration of the power conversion device according to the embodiment.

FIG. 5 is a circuit diagram illustrating an exemplary circuit configuration of the power conversion device 10 according to the embodiment. The illustration of FIG. 5 includes circuit elements not illustrated in FIG. 1.

DC power from a DC power source 30 is input to DC input terminals P and N of the power conversion device 10. In the embodiment, as an example, the DC power source 30 is a solar cell panel. AC output terminals U, V, and W of the power conversion device 10 are connected to a power system 40.

The power conversion circuit 1a can execute, according to a driving signal from the control means 20, each of inverter driving for converting DC power into three-phase AC power and converter driving for converting three-phase AC power into DC power.

The power conversion device 10 includes a DC side circuit that is connected to a DC side of the power conversion unit 1 and an AC side circuit that is connected to an AC side of the power conversion unit 1. The DC side circuit includes a DC side relay 3, a current transformer (CT) 8a, and a voltage transformer (VT) 8b.

The AC side circuit includes a transformer 2, a protection relay 4, an AC terminal relay 5, a reactor 6, a capacitor 7, current transformers (CT) 9a and 9c, and voltage transformers (VT) 9b and 9d. The transformer 2 is connected to an AC terminal of the power conversion unit 1. The reactor 6 is serially connected to the transformer 2. The capacitor 7 has one end connected between the transformer 2 and the reactor 6, and the other end connected to a reference potential such as ground. The protection relay 4 is serially connected to the reactor 6. The AC terminal relay 5 is serially connected to the protection relay 4. The current transformer 9a and the voltage transformer 9b are provided between the protection relay 4 and the AC terminal relay 5. The current transformer 9c is provided between the AC terminal of the power conversion unit 1 and the transformer 2. The voltage transformer 9d is provided between a point, at which the transformer 2 and the capacitor 7 are connected to each other, and the reactor 6. The DC side circuit and the AC side circuit can be configured in various ways, although mere examples thereof are illustrated in the embodiment.

The control means 20 is a control circuit. The power conversion control unit 20a of the control means 20 includes a PWM control unit 21 and a power control unit 22. The power control unit 22 acquires a DC side current value acquired via the current transformer 8a, a DC side voltage value acquired via the voltage transformer 8b, an AC side current value acquired via the current transformer 9a, and an AC side voltage value acquired via the voltage transformer 9b.

The power control unit 22 transmits, based on the acquired parameters, a "power control signal" to the PWM control unit 21. In the embodiment, as an example, the power control unit 22 includes a maximum power point tracking (MPPT) control mode, accordingly the power control signal may be a control command value based on MPPT control. Further, the power control signal may be a charge/discharge control command value based on an active power command value and a reactive power command value.

The PWM control unit 21 acquires the AC side current value acquired via the current transformer 9c and the AC side voltage value acquired via the voltage transformer 9d. The PWM control unit 21 generates, based on the acquired parameters, a switching element driving signal according to the power control signal from the power control unit 22. In the embodiment, this driving signal is a pulse width modulation signal (PWM signal).

The temperature control unit 20b of the control means 20 includes a cooling control unit 20b1 and a mode control unit 20b2. The temperature detection signal $T_1$ from the temperature sensor 31 is input to the temperature control unit 20b. The cooling control unit 20b1 can switch a cooling control mode of the cooling means 33 (cooling fan) among normally driving (normally ON), intermittent driving (intermittent ON), and stop (OFF).

The mode control unit 20b2 can instruct the cooling control mode to the cooling control unit 20b1 and also instruct a power conversion mode to the power conversion circuit 1a. The mode control unit 20b2 instructs the power conversion circuit 1a to perform driving in at least one of "AC-DC conversion mode" and "low power factor AC-DC conversion mode".

The AC-DC conversion mode is a mode for driving the power conversion circuit 1a so as to generate DC power from AC power. Since the freewheeling diode 111 is used as a rectifier in the AC-DC conversion mode, current flows through the freewheeling diode 111. As a result, heat generation occurs in the freewheeling diode 111, and this heat generation realizes heating and softening of the phase change materials 120.

The AC-DC conversion mode may also be referred to as a "charge mode", for convenience in the embodiment. This is because the mode for causing the power conversion unit 1 to generate direct current from alternating current is generally utilized as a mode for generating DC power from the power system 40 and charging a battery. At the time of testing with a testing device 200 described below with reference to FIG. 6, the AC-DC conversion mode is used as the charge mode.

The "low power factor AC-DC conversion mode" is a mode for driving the power conversion circuit 1a to generate AC power from DC power at a predetermined target power factor φ less than 1. Since low power factor power conversion is performed in the low power factor AC-DC conversion mode, a relatively large amount of reactive current flows through the power conversion circuit 1a. As a result, heat generation occurs in the freewheeling diode 111, and this heat generation realizes heating and softening of the phase change materials 120.

Since there is no limitation on the value of the target power factor φ, the target power factor can be arbitrarily set in a range of 0<φ<1.0. For example, the target power factor φ may be any one of 0.9, 0.8, 0.7, . . . , 0.2, and 0.1. For example, a setting range of the target power factor φ may be determined. An upper-limit target power factor may be selected from φ=0.99 to 0.5, for example. A lower-limit target power factor may be selected from φ=0.49 to 0.01, for example. An arbitrary upper-limit target power factor and an arbitrary lower-limit target power factor may be used to define the setting range.

The low power factor AC-DC conversion mode may also be referred to as a "low power factor discharge mode" for convenience in the embodiment. This is because the mode for causing the power conversion unit 1 to generate alternating current from direct current is utilized as a mode for discharging the power from the battery to the power system 40 side. At the time of testing with the testing device 200 described below with reference to FIG. 6, the low power factor AC-DC conversion mode is used as the low power factor discharge mode.

The control means 20 includes a predetermined "heating operation". The heating operation drives the power conversion circuit 1a, in a state where the cooling means 33 is stopped or intermittently operated, in such a manner that heat generation occurs in both of the semiconductor switching elements 110 and the freewheeling diodes 111.

In the heating operation, the cooling means 33 is set to the cooling control mode of any one of stop, intermittent operation, and normally driving. In the heating operation, the power conversion mode of the power conversion circuit 1a is set to at least one of the "AC-DC conversion mode" and the "low power factor AC-DC conversion mode".

As an example, the heating operation may execute the "AC-DC conversion mode" in the state where the cooling means 33 is stopped or intermittently operated. As another example, the heating operation may execute the "low power factor AC-DC conversion mode" in the state where the cooling means 33 is stopped or intermittently operated.

Further, as another example, the heating operation may be constructed so as to perform switching from a "first power conversion mode" to a "second power conversion mode", in the state where the cooling means 33 is stopped or intermittently operated. One of the AC-DC conversion mode and the low power factor AC-DC conversion mode is designated as the first power conversion mode, and the other is designated as the second power conversion mode. The switching timing may be the timing when a predetermined time has elapsed after starting the heating operation, or may be the timing when the module temperature of the power conversion module 100 has reached a predetermined temperature after starting the heating operation.

Control parameters for executing the heating operation include a "heating operation time" and a "heating operation output power". The heating operation time is the length of time during which the heating operation is continuously executed.

The heating operation output power is the magnitude of the output power of the power conversion circuit 1a when performing the heating operation. Actually, the heating operation output power may be variably set by adjusting various control target values for controlling the power conversion circuit 1a. For example, in the charge mode, to variably set the heating operation output power, a magnitude adjustment of charge power and charge current (effective current) may be performed. For example, in the low power factor discharge mode, to variably set the heating operation output power, a magnitude adjustment of discharge current (effective current) and reactive current may be performed.

Figure 6:
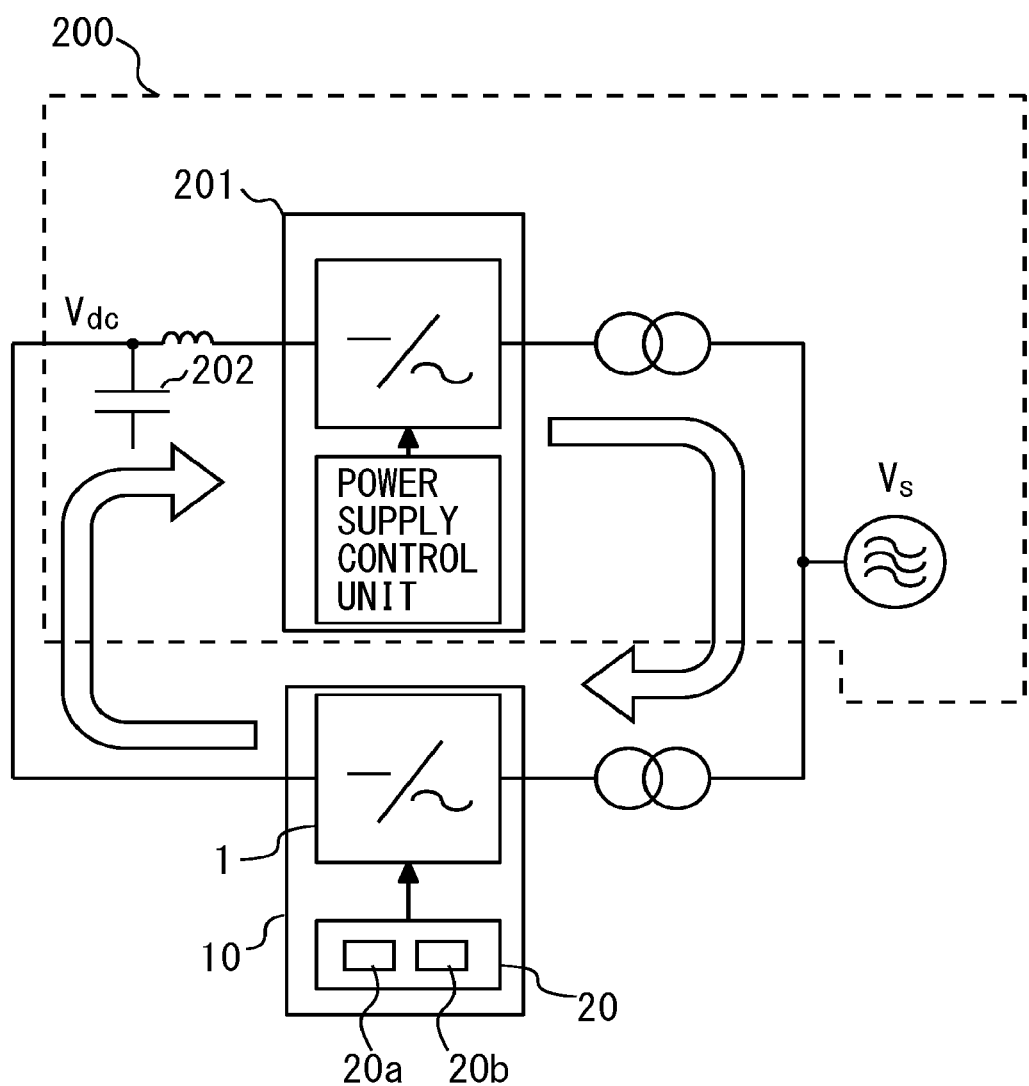
FIG. 6 is a diagram illustrating an example of a testing device for the power conversion device according to the embodiment.

FIG. 6 is a diagram illustrating an example of the testing device 200 for the power conversion device 10 according to the embodiment. The testing device 200 has a power circulation type system configuration.

The power circulation type system configuration includes an annular connection of a power supply unit 201, an AC power source Vs, the power conversion device 10, which is a testing object, and a DC capacitor 202. By maintaining the output balance between the power supply unit 201 and the power conversion device 10, most of the power can be circulated. As a result, power consumption at the time of testing can be suppressed.

The AC-DC conversion mode, i.e., the charge mode, is illustrated in FIG. 6, and as indicated by an outlined arrow, the three-phase AC power output from the power supply unit 201 is transmitted to the AC terminal of the power conversion device 10. The power conversion device 10 generates DC power from the three-phase AC power and output the generated DC power to the DC capacitor 202 side. On the other hand, in the low power factor AC-DC conversion mode, i.e., in the low power factor discharge mode, the power circulates in a direction opposite to that illustrated in FIG. 6.

Figure 7:
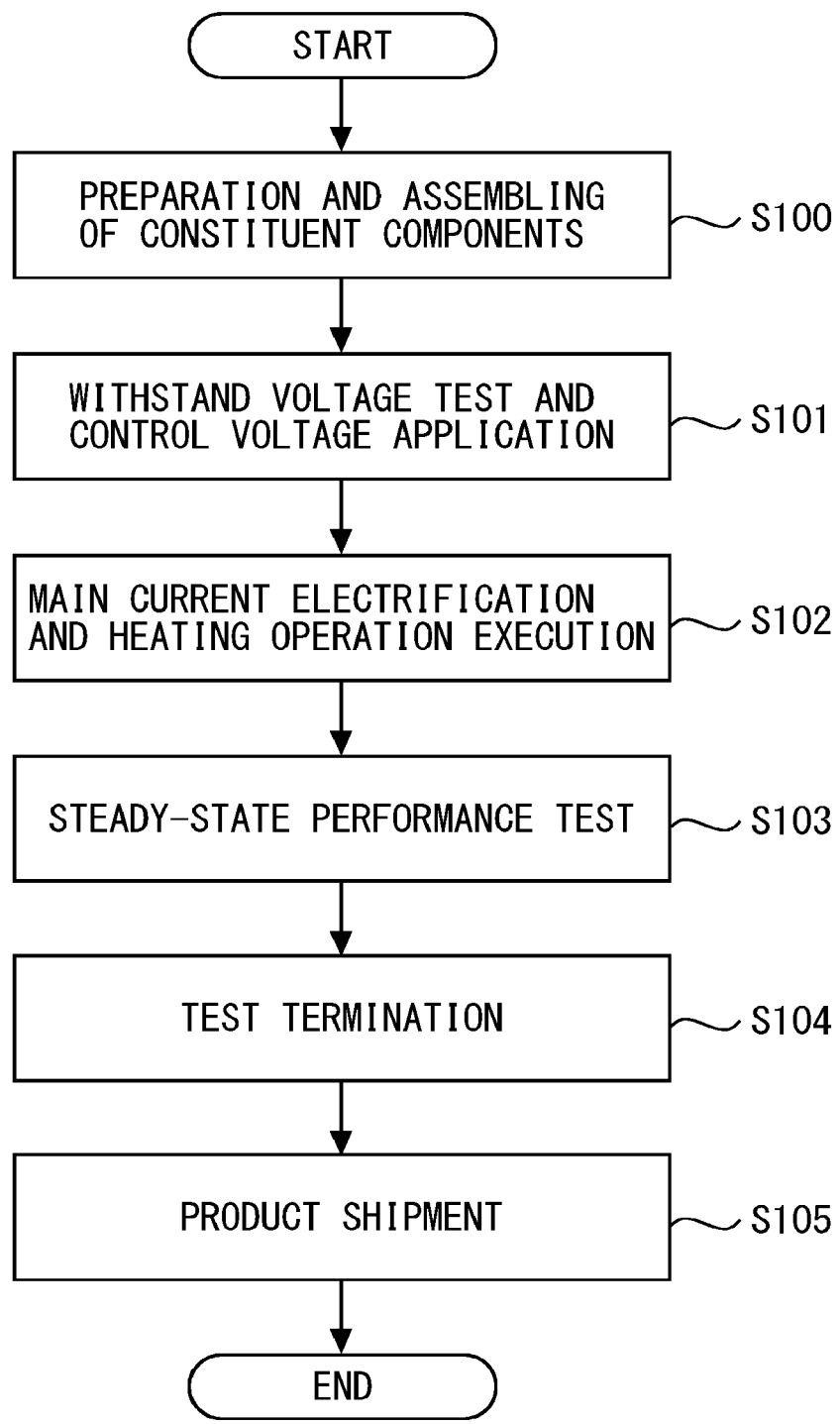
FIG. 7 is a flowchart illustrating a method for manufacturing the power conversion device according to the embodiment.

FIG. 7 is a flowchart illustrating a method for manufacturing the power conversion device 10 according to the embodiment. As illustrated in FIG. 7, the manufacturing method includes, first, preparing and assembling constituent components (step S100). In this step, the power conversion module 100 in which the phase change materials 120 are provided on the principal plane 101 is prepared. Further, the heat dissipation surface 50a of the heat dissipation member 50 and the principal plane 101 are overlapped so that the phase change materials 120 are sandwiched therebetween.

The manufacturing method includes, subsequently, performing a product pre-shipment test described in steps S101 to S103. At least step S102 of the product pre-shipment test is performed by the above-described testing device 200 illustrated in FIG. 6.

The manufacturing method includes, first, performing withstand voltage testing and control voltage testing for the power conversion unit 1 and the power conversion device 10 (step S101).

The manufacturing method includes, subsequently, executing a main circuit electrification and heating operation (step S102). In this step, the power conversion unit 1 starts electrifying the main current. The heating operation in step S102 is an operation for driving the power conversion circuit 1a, in the state where the cooling means 33 for cooling the heat dissipation member 50 is stopped or intermittently operated, in such a manner that heat generation occurs in both of the semiconductor switching elements 110 and the freewheeling diodes 111. For example, when a heating operation mode signal $S_{M1}$ is input to the control means 20, the heating operation may be executed in response to this signal. As a result, the phase change materials 120 are heated and softened, and the adhesion can be improved.

The manufacturing method includes, next, performing a steady-state performance test for the power conversion device 10 (step S103). The manufacturing method includes, subsequently, terminating the test (step S104) and performing product shipment (step S105).

Figure 8:
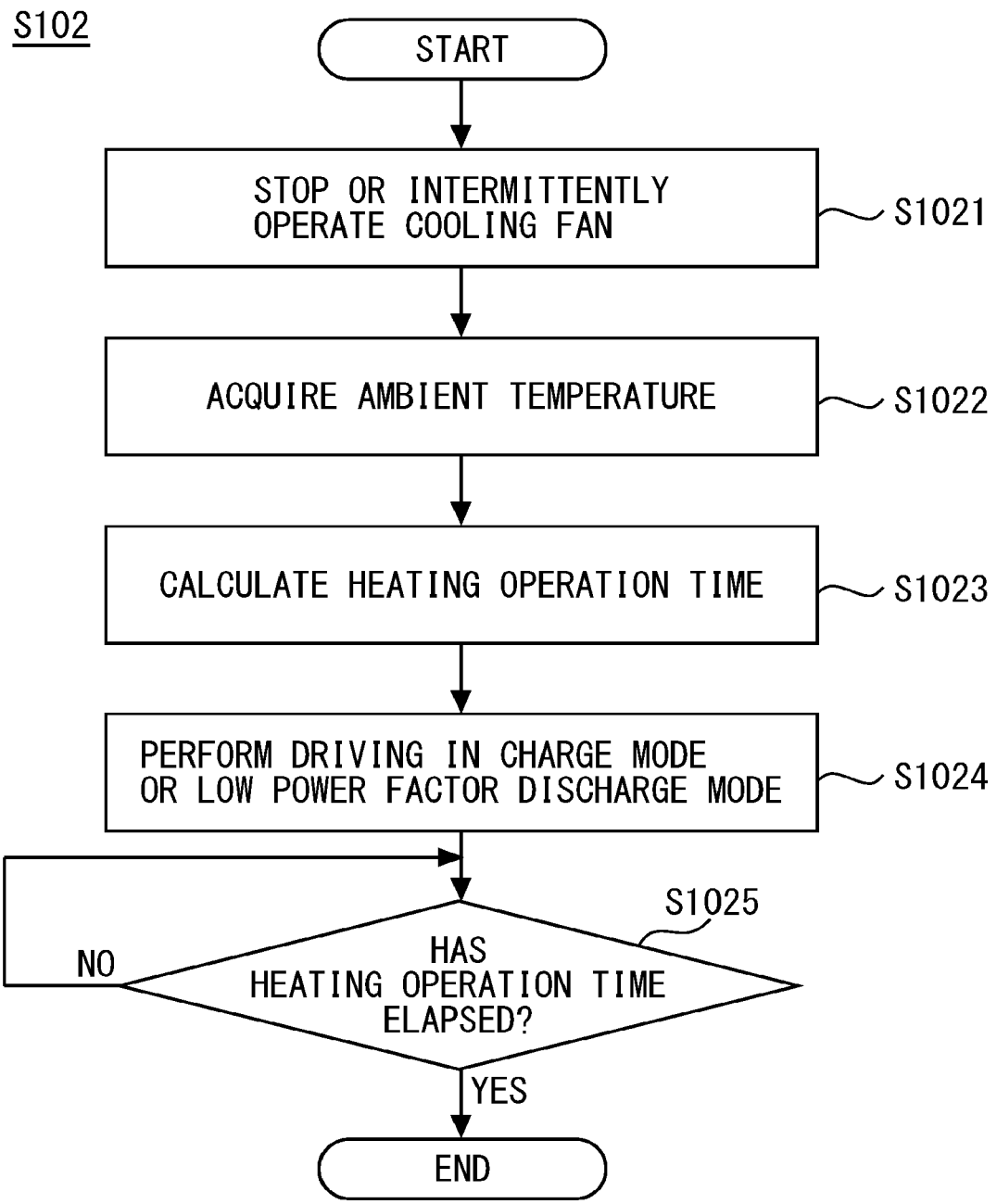
FIG. 8 is a flowchart illustrating a heating operation performed by the power conversion device according to the embodiment.

FIG. 8 is a flowchart illustrating the heating operation performed by the power conversion device 10 according to the embodiment. FIG. 8 illustrates details of the content of step S102 in FIG. 7. The routine illustrated in FIG. 8 is processing to be mainly executed by the mode control unit 20$b$2.

The routine illustrated in FIG. 8 includes, first, stopping the cooling means 33 (step S1021). As a modified example, instead of stopping, the routine may include performing an intermittent operation for switching between the operation and the stopping at predetermined intervals.

The routine includes substantially detecting, via the temperature sensor 31, the ambient temperature $T_1$ of the power conversion module 100 (step S1022).

The routine includes, substantially, calculating a heating operation time $T_{OP}$ (step S1023). A specific content of the processing for calculating the heating operation time will be described below with reference to FIG. 9.

The routine includes, substantially, driving the power conversion circuit 1$a$ in the charge mode (step S1024). As a result, in the state where the cooling means 33 for cooling the heat dissipation member 50 is stopped or intermittently operated, heat generation occurs in both of the semiconductor switching elements 110 and the freewheeling diodes 111.

When respective semiconductor switching elements 110 heat the phase change materials 120 positioned immediately below during the heating operation, the temperature of the phase change material 120 is also referred to as a "first temperature". When respective freewheeling diodes 111 heat the phase change materials 120 positioned immediately below during the heating operation, the temperature of the phase change material 120 is also referred to as a "second temperature".

In the embodiment, as an example, the first temperature and the second temperature are equal to or higher than the softening temperature of the phase change material 120, and the first temperature and the second temperature are substantially the same. For example, the error range of about 1° C. to several ° C. may be regarded as substantially the same temperature. It suffices to generate a required quantity of heat so that the phase change materials 120 are evenly heated and softened on the entire principal plane 101. Therefore, a first heat quantity and a second the heat quantity may be the same, although it is not essential. Alternatively, at least one of the first heat quantity and the second heat quantity may be greater than the other. For example, there may be a temperature difference of several ° C. or more between the first temperature and the second temperature.

The routine includes, next, determining whether the heating operation time having been set in step S1023 has elapsed (step S1025). The processing returns to step S1025 until the heating operation time elapses, and this routine terminates when the heating operation time has elapsed.

Figure 9:
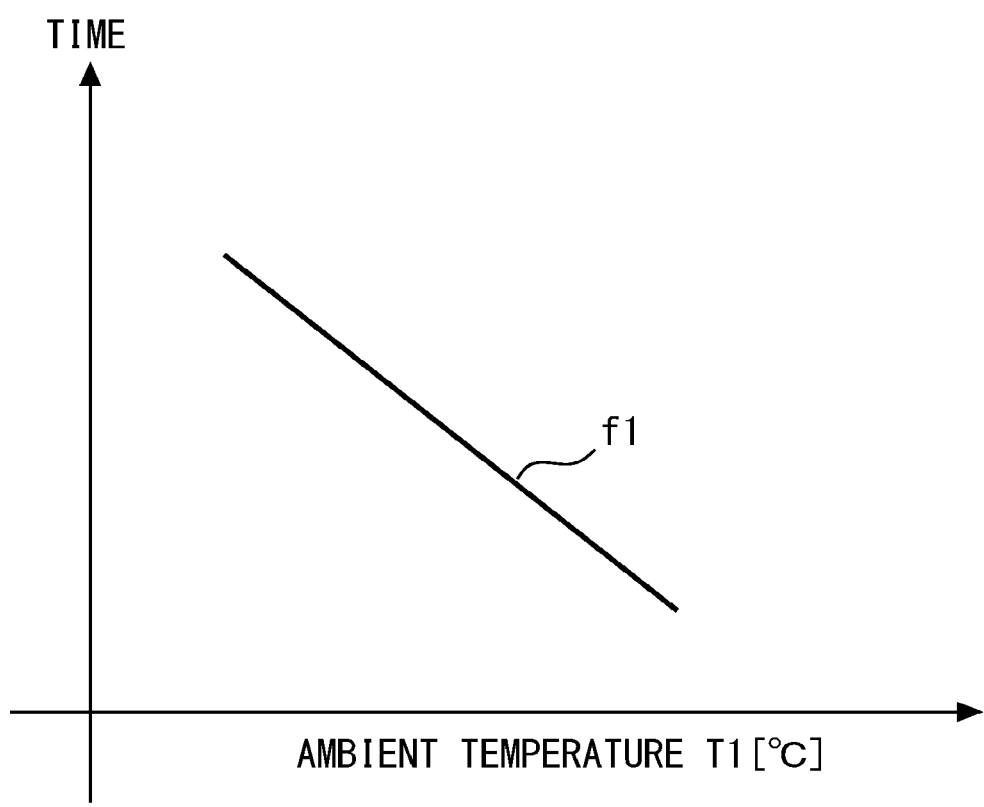
FIG. 9 is a graph illustrating behavior in a heating operation performed by the power conversion device according to the embodiment.

FIG. 9 is a graph for explaining behavior in the heating operation performed by the power conversion device 10 according to the embodiment. Specifically, FIG. 9 is a diagram explaining the processing for calculating the heating operation time.

The control means 20 may be constructed in such a manner that the heating operation time $T_{OP}$, which is the time during which the heating operation is executed, is variably set based on the ambient temperature $T_1$ detected by the temperature sensor 31. The control means 20 may include a first predetermined function or a first predetermined model that is determined to calculate the heating operation time $T_{OP}$ to be shorter as the ambient temperature $T_1$ is higher.

The first predetermined function or the first predetermined model defines a tendency f1 of the heating operation time $T_{OP}$ according to the ambient temperature $T_1$. FIG. 9 illustrates an example of the tendency f1. The tendency f1 may be determined by a constant rate of change, i.e., a linear function, having characteristics illustrated in FIG. 9. As a modified example, instead of using the characteristics illustrated in FIG. 9, a curve-like tendency such as a quadratic or higher function may be used. A stepwise tendency that causes a stepwise change so as to shorten the heating operation time $T_{OP}$ each time the ambient temperature $T_1$ rises by a predetermined temperature may be used. A polygonal graph-like tendency, which is a combination of two or more straight lines mutually different in rate of change, may be used.

As described above, the power conversion device 10 and the method for manufacturing the power conversion device 10 according to the embodiment can execute the heating operation at specific timing such as the product pre-shipment test. The heating operation can realize an operational state where heat generation occurs in both of the semiconductor switching elements 110 and the freewheeling diodes 111 while suppressing the driving of the cooling means 33.

According to this heating operation, in a state where the temperature unevenness is suppressed in a region adjacent to the semiconductor switching elements 110 and the freewheeling diodes 111 on the principal plane 101, the phase change materials 120 can be heated and softened. As a result, it is possible to suppress the unevenness occurring in the heating and softening of the phase change materials 120.

A method for heating the phase change materials 120 includes heating by heat generation by driving the power conversion module 100 and heating by external equipment such as a heater. In an MPPT driving mode or the like, electrification of the semiconductor switching elements 110 is mainly performed, and it is usual that the heat generation amount of the freewheeling diodes 111 is very small compared to that of the semiconductor switching elements 110. Accordingly, as a problem in the MPPT driving mode or the like, temperature unevenness is likely to arise at the time of heating. Further, as a problem in the heating by the external equipment such as a heater, production efficiency may decrease because of the increase in dedicated equipment and in work time and effort. In this respect, the heating operation according to the embodiment can surely suppress the unevenness in heating and softening of the phase change materials 120 with higher production efficiency.

Hereinafter, a modified example of the embodiment will be additionally described. FIG. 10 and FIG. 11 are tables illustrating variations of the heating operation performed by the power conversion device 10 according to the embodiment.

FIG. 10 and FIG. 11 illustrate variations with respect to the combination of heating operation mode number (No. 1 to No. 50), cooling control mode type, power conversion mode type, heating operation time determination method, and heating operation output power determination method. The power conversion mode type includes the number of modes, and contents of the first power conversion mode and the second power conversion mode.

For example, in the heating operation mode of No. 1, the cooling means 33 is stopped (OFF), the power conversion mode is only the charge mode, the heating operation time is calculated according to above-described step S1023, and the heating operation output power is set to a predetermined fixed value. Following the similar rule, mode contents of No. 2 to No. 50 can be read from the tables of FIG. 10 and FIG. 11.

(Variable Settings of Heating Operation Output Power)

In the heating operation modes of Nos. 6 to 15, Nos. 21 to 30, Nos. 36 to 40, and Nos. 46 to 50, the "heating operation output power" is variably set by calculation. A modified example in which the heating operation output power is variably set is described below.

Figure 12:
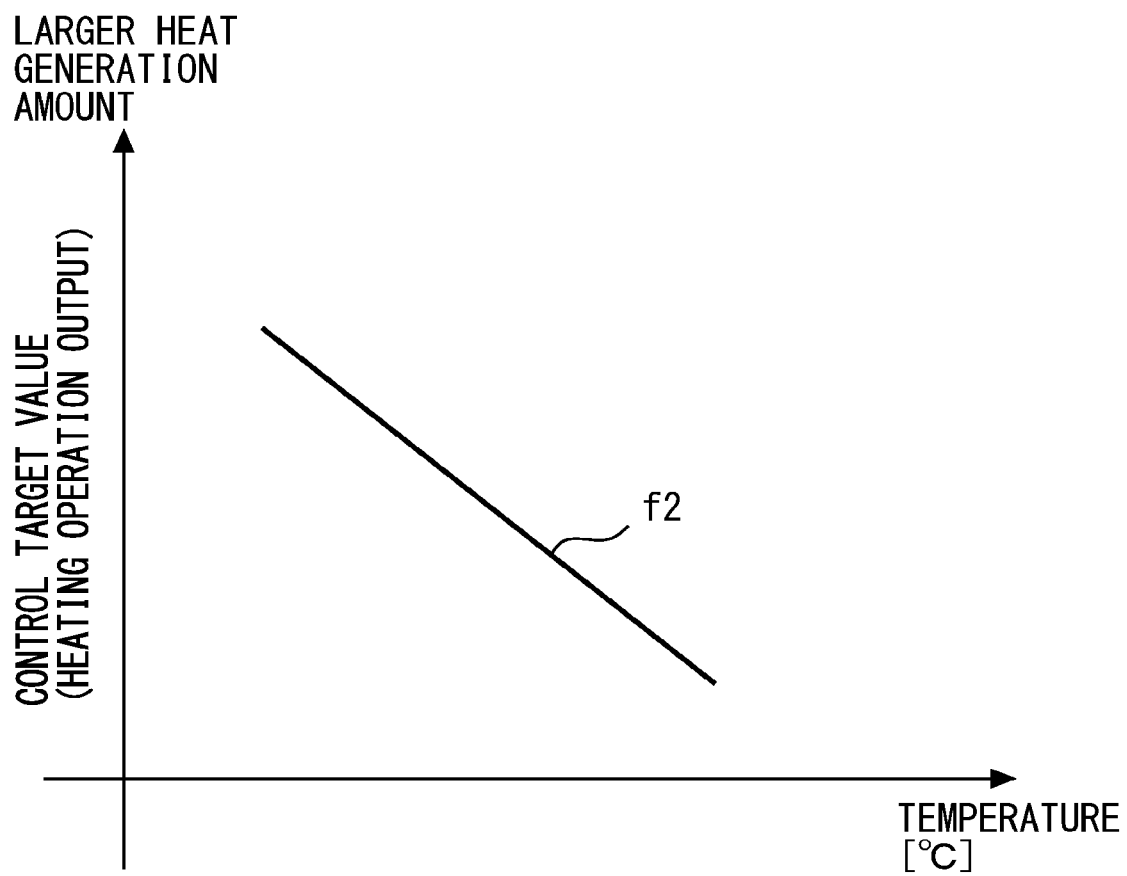
FIG. 12 is a graph illustrating behavior in a heating operation performed by the power conversion device according to a modified example of the embodiment.
Figure 13:
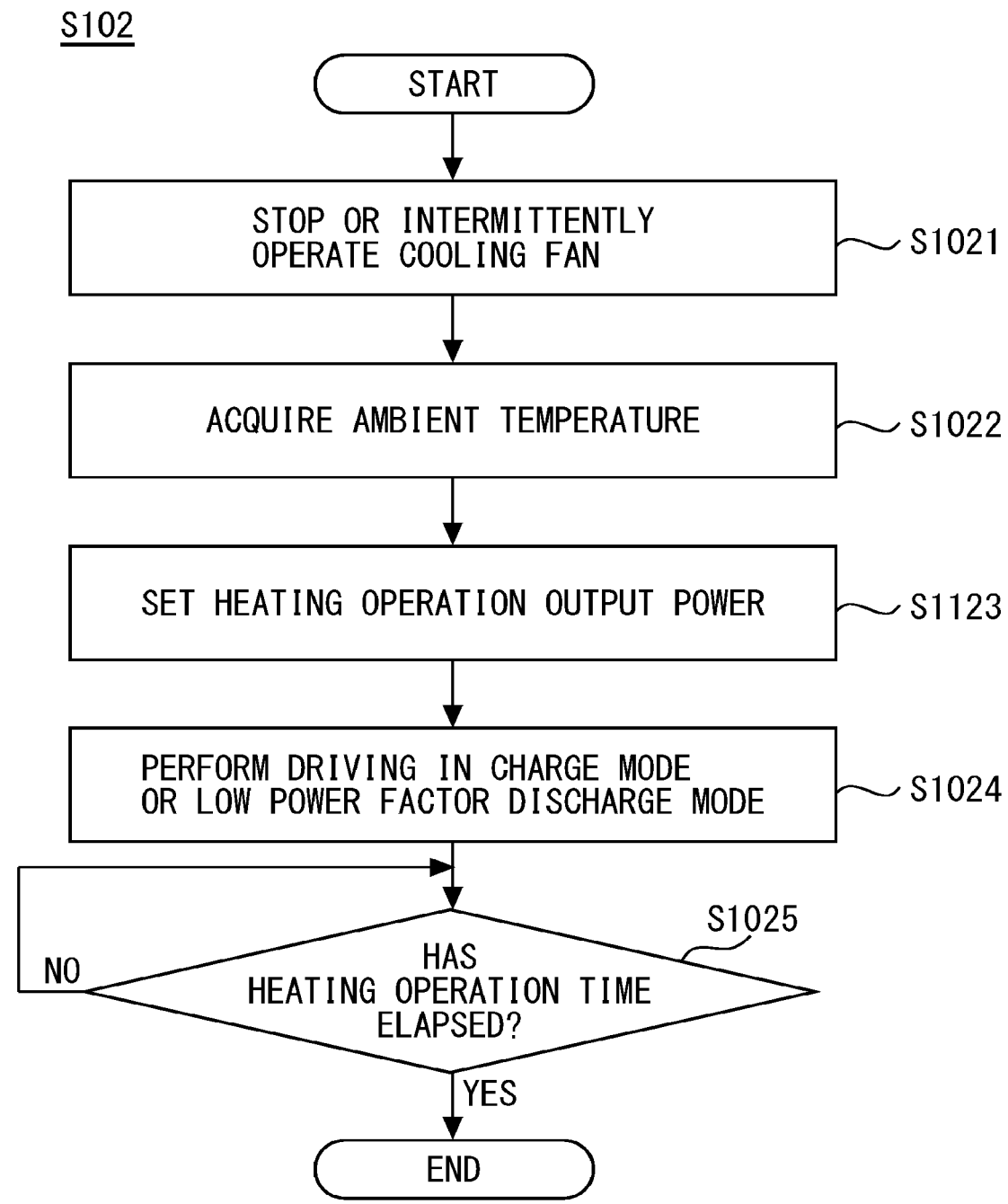
FIG. 13 is a flowchart illustrating a heating operation performed by the power conversion device according to the modified example of the embodiment.

FIG. 12 is a graph for explaining behavior in the heating operation performed by the power conversion device 10 according to a modified example of the embodiment. FIG. 13 is a flowchart illustrating a heating operation performed by the power conversion device 10 according to a modified example of the embodiment. In this modified example, the control means 20 calculates various control target values so as to variably set the heating operation output power based on the ambient temperature $T_1$ detected by the temperature sensor 31.

The various control target values may include at least one of active power target value, reactive current target value, and target power factor. The control means 20 may include a second predetermined function or a second predetermined model that is determined in such a manner that the heating operation output power is calculated to be smaller as the ambient temperature $T_1$ is higher. In the second predetermined function or the second predetermined model, a tendency f2 that sets various control target values for the ambient temperature $T_1$ is determined. FIG. 12 illustrates an example of the tendency f2.

The modified example can be attained by executing the flowchart illustrated in FIG. 13. In contents, FIG. 13 differs from FIG. 8 in that step S1023 is replaced by step S1123. In step S1123, by referring to the tendency f2 illustrated in FIG. 12, various control target values are adjusted according to the ambient temperature $T_1$. As an example of step S1123, the control means 20 may increase the active current target value in the AC-DC conversion mode (charge mode) as the ambient temperature $T_1$ rises. Further, as another example of step S1123, it is desired that the control means 20 may increase the reactive current target value, in other words, may decrease the target power factor, in the low power factor AC-DC conversion mode as the ambient temperature $T_1$ rises.

The tendency f2 may be determined by a constant rate of change, i.e., a linear function, as illustrated in FIG. 12. As a modified example of the tendency f2, a curve-like tendency such as a quadratic or higher function may be used. A stepwise tendency that causes a stepwise change so as to shorten the heating operation output power each time ambient temperature $T_1$ rises a predetermined temperature may be used. A polygonal graph-like tendency, which is a combination of two or more straight lines mutually different in rate of change, may be used.

(Continuous Driving of Cooling Means and Low Power Factor Discharge Mode)

Nos. 3, 8, 13, 18, and 23 in FIG. 10 and Nos. 28, 33, 38, 43, and 48 in FIG. 11 are heating operation modes in which the cooling means 33 is continuously operated (normally ON). Hereinafter, this modified example will be described.

Figure 14:
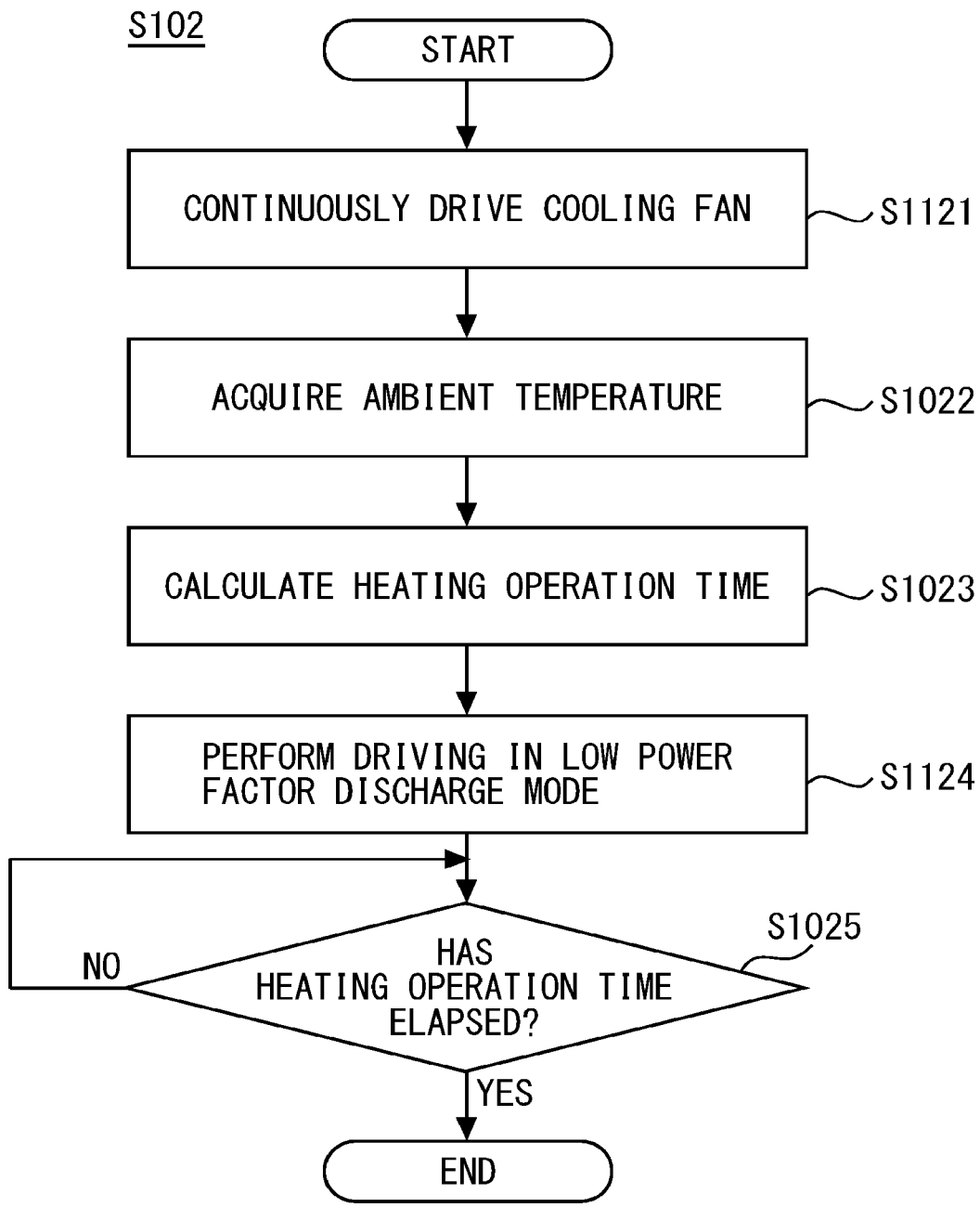
FIG. 14 is a flowchart illustrating the heating operation performed by the power conversion device according to the modified example of the embodiment.

FIG. 14 is a flowchart illustrating a heating operation performed by the power conversion device 10 according to the modified example of the embodiment. In this modified example, above-described steps S1021 and S1024 are replaced by steps S1121 and S1124. In this modified example, in step S1121, the cooling means 33 is continuously driven. Further, in step S1124, the low power factor AC-DC conversion mode is executed in the state where the cooling means 33 is continuously driven.

As a modified example of the manufacturing method according to the embodiment, the content of step S102 may be modified to continuously drive the cooling means 33. That is, in the product pre-shipment test, the low power factor AC-DC conversion mode for driving the power conversion circuit 1a so as to generate AC power from DC power at a predetermined target power factor less than 1 may be executed, in the state where the cooling means 33 for cooling the heat dissipation member 50 is continuously driven.

(Heating Stop Based on Module Protection Temperature)

Figure 15:
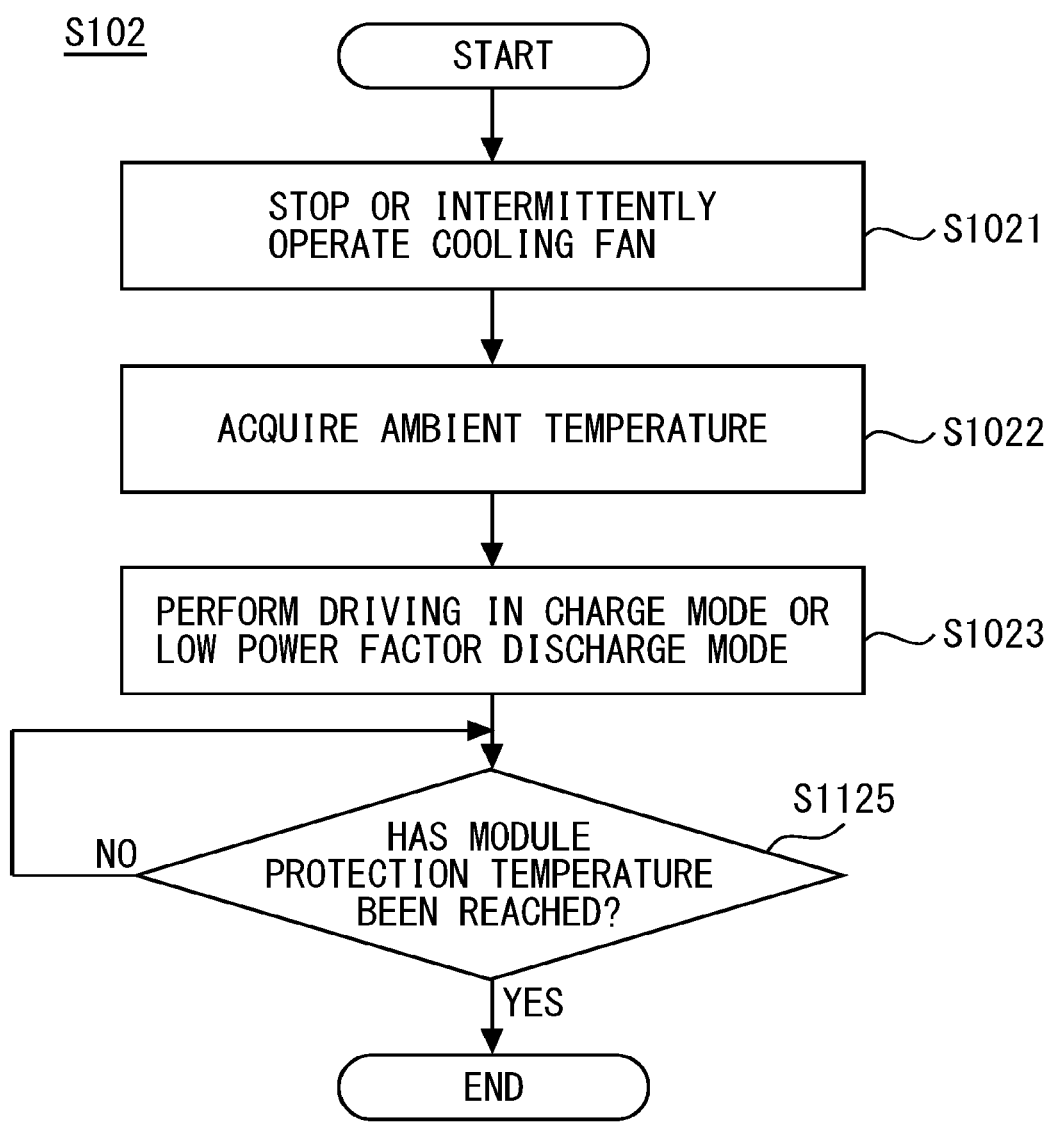
FIG. 15 is a flowchart illustrating the heating operation performed by the power conversion device according to the modified example of the embodiment.

The heating operation modes of Nos. 31 to 50 in FIG. 11 do not determine the heating operation time by calculation, but determine the heating operation time based on a module protection temperature. FIG. 15 is a flowchart illustrating a heating operation performed by the power conversion device 10 according to a modified example of the embodiment.

In the modified example illustrated in FIG. 15, above-mentioned step S1025 is replaced by step S1125. In step S1125, the control means 20 executes a heating operation until the power conversion module 100 reaches a predetermined module protection temperature, and terminates the heating operation when the temperature of the power conversion module 100 reaches the module protection temperature. The module protection temperature is determined beforehand so as to be included in specifications of the power conversion module 100. In addition to the temperature sensor 31, a module temperature sensor for accurately detecting the temperature of the power conversion module 100 may be provided separately.

There are other alternative modified examples not illustrated in FIG. 10 and FIG. 11. For example, both the heating operation time and the heating operation time may be fixed. This is because it is possible to preset, based on calculations or the like, the time and output required for the phase change materials 120 to be sufficiently softened.

A plurality of different heating operation modes may be selected from the group consisting of the variations illustrated in FIG. 10 and FIG. 11 and the above-mentioned alternative modified examples. The selected plurality of heating operation modes may be stored in the mode control unit 20b2. This makes it possible, for example, to properly use different heating operation variations according to product specifications of the power conversion device 10, or according to specifications and test conditions or the like of the testing device 200.

The power conversion device 10 is not limited in use. The power conversion device 10 may be provided as the power conversion device 10 for a solar power generation system, or may be provided as the power conversion device 10 for an electric motor driving system, or may be provided as the power conversion device 10 for an uninterruptable power supply system. That is, the DC power source 30 is not limited, and various configurations are applicable. The DC power source 30 may be a battery. The DC power source 30 may be a DC power source configured by a wind power generator and a converter. The DC power source 30 may be a DC power source configured by an AC power source and a converter. An electric motor or another load may be connected instead of the power system 40.

The functions of the control means 20 may be realized by processing circuitry. The processing circuitry may be a dedicated hardware circuitry. The processing circuitry may include a processor and a memory. The processing circuitry may be partly configured as a dedicated hardware circuitry and may additionally include a processor and a memory.

In the case where at least a part of the processing circuitry is at least one dedicated hardware circuitry, the processing circuitry is, for example, a single circuit, a composite circuit, a programmed processor, a parallel-programmed processor, an ASIC, an FPGA, or a combination thereof.

In the case where the processing circuitry includes at least one processor and at least one memory, each function of the control means 20 can be realized by software, firmware, or a combination of software and firmware. The software and the firmware are described as programs and stored in the memory. The processor reads out and executes the program stored in the memory to realize the functions of respective components. The processor may also be referred to as a central processing unit (CPU), a central processor, a processing device, an arithmetic device, a microprocessor, a microcomputer, or a DSP. The memory is, for example, a nonvolatile or volatile semiconductor memory such as RAM, ROM, a flash memory, an EPROM, or an EEPROM.

In this way, the processing circuitry can realize each function of the control means 20 by hardware, software, firmware, or a combination thereof.

REFERENCE SIGNS LIST 1 power conversion unit
1a power conversion circuit
1b gate drive substrate
2 transformer
3 DC side relay
4 protection relay
5 AC terminal relay
6 reactor
7 capacitor
8a, 9a, 9c current transformer (CT)
8b, 9b, 9d voltage transformer (VT)
10 power conversion device
20 control means
20a power conversion control unit
20b temperature control unit
20b1 cooling control unit
20b2 mode control unit
21 PWM control unit
22 power control unit
30 DC power source
31 temperature sensor
33 cooling means (cooling fan)
40 power system
50 heat dissipation member
50a heat dissipation surface
100 power conversion module
100a casing
101 principal plane (lower surface)
102 upper surface
103 side surface
110 semiconductor switching element
111 freewheeling diode
112 substrate
114 heat dissipation plate
116 resin sealing material
120 phase change material
200 testing device
201 power supply unit
202 DC capacitor
$S_f$ fan control signal
$S_{M1}$ heating operation mode signal
$S_{PWM}$ PWM signal
$T_1$ temperature detection signal (ambient temperature)
$T_{OP}$ heating operation time

The invention claimed is:

1. A power conversion device comprising:
a power conversion module including a casing having a principal plane, and a semiconductor switching element and a freewheeling diode housed in the casing and arranged in a plane direction of the principal plane, in which the semiconductor switching element and the freewheeling diode configure a power conversion circuit;
a phase change material provided on the principal plane of the casing;
a heat dissipation member including a heat dissipation surface, in which the heat dissipation surface is overlapped with the principal plane to sandwich the phase change material;
cooling means for cooling the heat dissipation member; and
control means for generating a driving signal for driving the power conversion circuit and controlling the cooling means,
the control means including a predetermined heating operation,
the heating operation executing, in a state where the cooling means is stopped or intermittently operated, a low power factor AC-DC conversion mode for driving the power conversion circuit so as to generate AC power from DC power at a predetermined target power factor less than 1.

2. A power conversion device comprising:
a power conversion module including a casing having a principal plane, and a semiconductor switching element and a freewheeling diode housed in the casing and arranged in a plane direction of the principal plane, in which the semiconductor switching element and the freewheeling diode configure a power conversion circuit;
a phase change material provided on the principal plane of the casing;
a heat dissipation member including a heat dissipation surface, in which the heat dissipation surface is overlapped with the principal plane to sandwich the phase change material;
cooling means for cooling the heat dissipation member; and
control means for generating a driving signal for driving the power conversion circuit and controlling the cooling means,
the control means including a predetermined heating operation,
the heating operation being constructed to switch from one of an AC-DC conversion mode and a low power factor AC-DC conversion mode to the other in a state where the cooling means is stopped or intermittently operated,
the AC-DC conversion mode being for driving the power conversion circuit to generate DC power from AC power, and
the low power factor AC-DC conversion mode is for driving the power conversion circuit so as to generate AC power from DC power at a predetermined target power factor less than 1.

3. A method for manufacturing a power conversion device, the method comprising:

a process for preparing a power conversion module including a casing having a principal plane and a phase change material provided on the principal plane, in which the power conversion module includes a semiconductor switching element and a freewheeling diode housed in the casing and arranged in a plane direction of the principal plane, and the semiconductor switching element and the freewheeling diode configure a power conversion circuit;

a process for overlapping a heat dissipation surface of a heat dissipation member with the principal plane so as to sandwich the phase change material; and a process for performing a heating operation for heating the phase change material in a product pre-shipment test, the heating operation executing, in a state where cooling means for cooling the heat dissipation member is continuously driven, a low power factor AC-DC conversion mode for driving the power conversion circuit so as to generate AC power from DC power at a predetermined target power factor less than 1.

* * * * *